United States Patent
Biber et al.

(10) Patent No.: US 11,408,956 B2
(45) Date of Patent: Aug. 9, 2022

(54) MAGNETIC RESONANCE TOMOGRAPHY SYSTEM WITH B0 MODULATION AND METHOD FOR OPERATION

(71) Applicant: Siemens Healthcare GmbH, Erlangen (DE)

(72) Inventors: Stephan Biber, Erlangen (DE); Markus Vester, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/155,595

(22) Filed: Jan. 22, 2021

(65) Prior Publication Data

US 2021/0255267 A1 Aug. 19, 2021

(30) Foreign Application Priority Data

Feb. 13, 2020 (EP) .................................. 20157178

(51) Int. Cl.
*G01R 33/565* (2006.01)
*G01R 33/36* (2006.01)
(Continued)

(52) U.S. Cl.
CPC ... *G01R 33/56563* (2013.01); *G01R 33/3621* (2013.01); *G01R 33/3815* (2013.01); *G01R 33/543* (2013.01)

(58) Field of Classification Search
CPC .......... G01R 33/56563; G01R 33/3621; G01R 33/3815; G01R 33/543; G01R 33/422; G01R 33/445; G01R 33/4818
See application file for complete search history.

(56) References Cited

U.S. PATENT DOCUMENTS

2008/0048658 A1 2/2008 Hushek
2017/0293005 A1 10/2017 Panther
(Continued)

FOREIGN PATENT DOCUMENTS

| EP | 3467531 A1 | 4/2019 |
|---|---|---|
| EP | 3591420 A1 | 1/2020 |
| WO | 2016173861 A1 | 11/2016 |

OTHER PUBLICATIONS

Alford, Jamu K., et al. "Design and construction of a prototype high-power B0 insert coil for field-cycled imaging in superconducting MRI systems." Concepts in Magnetic Resonance Part B: Magnetic Resonance Engineering: An Educational Journal 35.1 (2009): 1-10.

(Continued)

*Primary Examiner* — Susan S Lee
(74) *Attorney, Agent, or Firm* — Lempia Summerfield Katz LLC (57) ABSTRACT

The disclosure relates to a magnetic resonance tomography system and to a method for operation of the magnetic resonance tomography system. The magnetic resonance tomography system has a magnetic unit, which is configured to change a homogeneous magnetic field B0 with a magnetic field strength, which may vary between a first predetermined value on exciting nuclear spins and a second predetermined value on receiving magnetic resonance signals, in a measuring volume in a short, predetermined time, controlled by the magnetic resonance tomography system.

18 Claims, 4 Drawing Sheets

1 Magnetic resonance tomography system
2 Longitudinal direction
10 Magnetic unit
11 Field magnet
12 Gradient coils
14 Body coil
16 Patient tunnel
20 Control unit
21 Gradient controller
22 Radio frequency unit
23 Controller
25 Signal bus
30 Patient couch
33 Connection line
36 Positioning unit
50 Local coil
60 Magnetic controller
70 Modulation coil
100 Patient (51) Int. Cl.
 *G01R 33/3815* (2006.01)
 *G01R 33/54* (2006.01)

(56) References Cited

U.S. PATENT DOCUMENTS

2018/0143272 A1   5/2018   Liu
2020/0249292 A1   8/2020   Biber
2020/0355764 A1*  11/2020  Popescu ............. G01R 33/5608

OTHER PUBLICATIONS

European Search Report for European Application No. 20157178.3-1010 dated Aug. 6, 2020.
Magnetic Resonance Centre, University of Warwick, "Field-Cycling MRI", https://warwick.ac.uk/fac/sci/physics/research/condensedmatt/imr_cdt/students/peter_james_ross/ffcmri/, Dec. 2012. pp. 1-3.
Prior Art Database "Magnetic Resonance Imaging (MRI) System With Mini Radio Frequency (RF) Shielding Room", IP.com, IP.com Inc., West Henrietta, NY, US, XP013137933, ISSN: 1533-0001; 2010. pp. 1-7.
Ross, P. James, Lionel M. Broche, and David J. Lurie. "Rapid field-cycling MRI using fast spin-echo." Magnetic resonance in medicine 73.3 (2015): 1120-1124.

* cited by examiner

FIG 1

| | |
|---|---|
| 1 Magnetic resonance tomography system | 30 Patient couch |
| 2 Longitudinal direction | 33 Connection line |
| 10 Magnetic unit | 36 Positioning unit |
| 11 Field magnet | 50 Local coil |
| 12 Gradient coils | 60 Magnetic controller |
| 14 Body coil | 70 Modulation coil |
| 16 Patient tunnel | 100 Patient |
| 20 Control unit | |
| 21 Gradient controller | |
| 22 Radio frequency unit | |
| 23 Controller | |
| 25 Signal bus | |

FIG 2

2   Longitudinal direction
10  Magnetic unit
11  Field magnet
16  Patient tunnel
21  Gradient controller
60  Magnetic controller
70  Modulation coil

FIG 3

2  Longitudinal direction
50 Local coil
51 Antenna coils
60 Magnetic controller
70 Modulation coil

MAGNETIC RESONANCE TOMOGRAPHY SYSTEM WITH B0 MODULATION AND METHOD FOR OPERATION

The present patent document claims the benefit of European Patent Application No. 20157178, filed Feb. 13, 2020, which is hereby incorporated by reference in its entirety.

TECHNICAL FIELD

The disclosure relates to a magnetic resonance tomography system with a magnetic unit and a magnetic controller, which is configured to change a homogeneous magnetic field B0 with a magnetic field strength, which may change between a first predetermined value and a second predetermined value, in a measuring volume in a short, predetermined time, controlled by the magnetic resonance tomography system.

BACKGROUND

Magnetic resonance tomography systems are imaging apparatuses, which for mapping an examination object orient nuclear spins of the examination object with a strong external magnetic field and by way of a magnetic alternating field excite them for precession about this orientation. The precession or return of the spins from this excited state into a state with less energy in turn generates in response a magnetic alternating field, which is received via antennas.

With the aid of magnetic gradient fields, a spatial encoding is impressed onto the signals, and this subsequently enables an allocation of the received signal to a volume element. The received signal is then evaluated and a three-dimensional imaging representation of the examination object provided. For reception of the signal, local receive antennas, what are known as local coils, may be used. In order to achieve a better signal-to-noise ratio, the receive antennas or local coils may be arranged directly on the examination object. The receive antennas may also be installed in a patient couch.

Magnetic resonance tomography systems require radio frequency shielding in two respects. Firstly, for excitation of the nuclear spins, radio frequency pulses with powers in the kilowatt range are absorbed only partially in the patient. Radio waves, which leave the patient feed-through, are emitted into the space and are shielded in order to adhere to emission limits, therefore.

Conversely, the magnetic resonance signals to be received for imaging are extremely weak. Shielding of external interference signal is necessary in order to achieve an adequate signal-to-noise ratio (SNR) here.

For this reason, in the prior art, expensive shielding rooms are installed around a magnetic resonance tomography system in order to reduce both emissions and immissions.

SUMMARY AND DESCRIPTION

It is an object of the disclosure, therefore to reduce the expenditure for shielding.

The object is achieved by a magnetic resonance tomography system as and a method for operation of the magnetic resonance tomography system, as disclosed herein. The scope of the present disclosure is defined solely by the appended claims and is not affected to any degree by the statements within this summary. The present embodiments may obviate one or more of the drawbacks or limitations in the related art.

The magnetic resonance tomography system has a magnetic facility or unit and a magnetic controller. The magnetic unit is configured to generate a homogeneous magnetic field B0 in a measuring volume by way of magnetic coils. The measuring volume is the volume in which the Larmor frequency L1 of the nuclear spins to be captured in the case of the first homogeneous magnetic field B01 matches the frequency of an excitation pulse of a magnetic alternating field B1, so the nuclear spins to be captured are excited in the measuring volume. The magnetic field in the measuring volume, in which the nuclear spins to be captured are excited by the excitation pulse with the frequency L1, is regarded as homogeneous within the meaning of the disclosure. The measuring volume is a subset of the volume as the Field of View in which, basically, image capture with the magnetic resonance tomography system is possible. The Field of View is defined, for example, by homogeneity requirements of the static homogeneous magnetic field B0 generated by a field magnet of the magnetic facility or unit, the homogeneity of the gradient fields, and of the magnetic alternating field B1 for excitation of the nuclear spins in that certain variations are not exceeded in the volume of the Field of View.

The measuring volume may be a slice for which nuclear spins are to be captured simultaneously. The selection of the slice is achieved by overlaying a magnetic field B0, which is spatially homogeneous over an entire Field of View, with a gradient field Gz. The selection may take place on excitation and/or receiving the magnetic resonance signals.

The magnetic unit is configured by the magnetic controller to change the homogeneous magnetic field between the first predetermined value of the magnetic field strength B01 on exciting the nuclear spins and a second predetermined value of the magnetic field strength B02 on receiving magnetic resonance signals of the excited nuclear spins to be captured in the measuring volume in a short, predetermined time, controlled by the magnetic resonance tomography system. As disclosed herein, the term 'short' may refer to a period that is shorter than the duration of a sequence, e.g., shorter than the interval of an excitation pulse to subsequent receiving of the magnetic resonance signals. The period may be shorter than 50 milliseconds (ms), 10 ms, or 1 ms. In other words, during receiving, the nuclear spins excited by the excitation pulse with a frequency L1 in the case of the magnetic field B01 send the magnetic resonance signals at a changed frequency L2, which is determined by the changed magnetic field B02, and are also received by the receiver at this frequency.

In one act in the method, a first magnetic field B01 is set in the measuring volume by the magnetic unit. In a further act, the nuclear spins to be captured are excited in the measuring volume by the magnetic alternating field B1 with the frequency L1 by way of the transmitter in the first homogeneous magnetic field B01.

In a further act, a second homogeneous magnetic field B02 is set in the measuring volume by the magnetic unit, and this differs from the first homogeneous magnetic field B01 by way of the magnetic field strength and the magnetic resonance signal of the nuclear spins is received from the measuring volume by the receiver.

The magnetic field strength of the homogeneous magnetic field B01 may differ, for example, by more than 0.1, 1, or 10 per mill from the magnetic field strength of the homogeneous magnetic field B02, for example by more than 1 mT, 5 mT, 10 mT, or 50 mT. The shift in the Larmor frequency due to the changed magnetic field B02 compared to B01 may be more than 10 kHz, 100 kHz, 500 kHz, or 1 MHz.

It is conceivable in this case that the homogeneous magnetic field in the measuring volume is changed only over a period of exciting the nuclear spins to the first magnetic field strength B01 or only over a period of reading to the second magnetic field strength B02. In this way, energy expenditure for the field change and an effect on the remaining sequence may be minimized.

Advantageously, owing to the change in the magnetic field B0 between exciting and receiving it is possible to perform the two processes in different frequency ranges and thus separate and filter interferences in the transmission frequency range from reception in the frequency domain that is sensitive to interferences.

In one conceivable embodiment of the magnetic resonance tomography system, a Larmor frequency of a nuclear spin to be examined lies in the case of the first value of the magnetic field strength of the first homogeneous magnetic field B01 in the measuring volume in an ISM band and in the case of the second value of the magnetic field strength of the second homogeneous magnetic field B02 in the measuring volume lies outside of the ISM band.

Released frequency bands, for which there are simplified rules in the case of emission and approval, are referred to as the industrial band for use by medical or technical devices. These are also referred to as ISM bands (Industrial, Scientific, Medical band). An exemplary frequency band, in which emissions at high powers are also permitted, lies between 26.9 and 27.3 MHz. Other frequency bands of this kind lie between 6.7 MHz and 6.8 MHz, 13.5 MHz and 13.6 MHz, 40.6 MHz and 40.7 MHz, and 433.0 MHz and 434.8 MHz Advantageously, fewer narrow limit values apply in an ISM band for emissions, so adherence during the excitation pulse without shielding is also conceivable. During receiving, the magnetic resonance signal is then exposed, owing to the changed magnetic field B02, outside of the ISM band and therewith lower interferences, optionally also without shielding.

In the case of the second magnetic field strength, the Larmor frequency may lie only slightly outside of the ISM band, (for example, by less than 0.1%, 1%, 5%, or 10%, or by less than 100 kHz, 1 MHz, or 5 MHz), so the magnetic field change is only small and may be achieved with less effort. At the same time, small changes at the receiver are then also necessary.

In one possible embodiment of the magnetic resonance tomography system, the magnetic resonance tomography system has a sensor for reception of an interference signal and active interference suppression for reducing an interference signal component in a received magnetic resonance signal as a function of the received interference signal. For example, it is conceivable that interference signals are acquired with an antenna and are added with adaptive scaling and phase shift to the received magnetic resonance signals in order to advantageously reduce the interference signal components in the magnetic resonance signal by way of destructive interference.

In one conceivable embodiment of the magnetic resonance apparatus, the magnetic unit has a superconducting magnet for generating a static magnetic field component and a resistive coil winding for generating a dynamic magnetic field component for modulation. The resistive coil winding may be configured to homogeneously change the magnetic field strength of the static magnetic field B0 of the superconducting magnet in the entire Field of View, in other words with the accuracy of a few ppm that is conventionally necessary in the framework of for the B0 field. It is also conceivable, however, that the change in the magnetic field strength takes place homogeneously only in the measuring volume. The resistive coil winding differs thereby in particular from the gradient coils, which are intended to bring about inhomogeneity, and shim coils, which are used for compensation of inhomogeneity due to local effect. Furthermore, the shim coils are not configured for short-term changes in the magnetic field strength, for example, owing to slow actuation. The combination of a permanent magnet with a resistive magnetic coil is also conceivable.

Advantageously, a resistive coil enables a short-term and fast modulation of the homogeneous B0 field generated by the superconducting coil or a permanent magnet.

In one possible embodiment of the magnetic resonance tomography system, the magnetic controller is configured to modulate the homogeneous magnetic field B0 in magnetic field strength with a code in order to spread the magnetic resonance signal in the frequency domain. For example, a resistive magnetic coil may be used together with a permanent magnet or a superconducting magnet in order to overlay a strong static B0 field with a rapidly changing component homogeneously in the measuring volume or in the entire Field of View if the coil is fed with an alternating current. The frequency may extend from a few hertz through to kilohertz or megahertz. The magnetic resonance signal undergoes a modulation due to the varying Larmor frequency in the resulting magnetic field and is spread in the frequency domain in a manner determined by the modulation signal and adopts a second, third or any number of different values of the magnetic field strength for the homogeneous magnetic field B03, B04 . . . B0n. For example, spread-spectrum modulations or modulation with pseudorandom sequences are also conceivable.

Advantageously, this prevents the magnetic resonance signal from being fully or largely covered by narrowband interference.

In one conceivable embodiment of the magnetic resonance tomography system, the magnetic resonance tomography system has a receiver with a decoding apparatus. The decoding apparatus is configured to determine from the spread magnetic resonance signal frequency spreading caused by the modulation of the magnetic field B0 with the code, measuring points in the k-space as a function of the code. It would be conceivable, for example, to reconstruct the original magnetic resonance signal from the spread signal again by the code. With a simple code from a sinusoidal signal the frequency spreading corresponds to a simple frequency modulation with a carrier frequency, the reconstruction then corresponds to a demodulation of the modulated signal. Depending on the code used, reconstruction takes place with a complementary demodulation or decoding method. For more complex code such as pseudorandom sequences, autocorrelation methods are also conceivable. The interference signal may also be removed or filtered before decoding.

It would also be conceivable, however, that the decoding apparatus determines the k-space points directly with a modified image reconstruction method instead of the Fourier transform from the received frequency-spread signal.

The method shares the advantages of the apparatus disclosed herein.

BRIEF DESCRIPTION OF THE DRAWINGS

The above-described properties, features, and advantages of this disclosure and the manner in which they are achieved will become clearer and more comprehensible in conjunction with the following description of the exemplary embodiments, which will be explained in more detail in connection with the drawings.

In the drawings.

DETAILED DESCRIPTION

Figure 1:
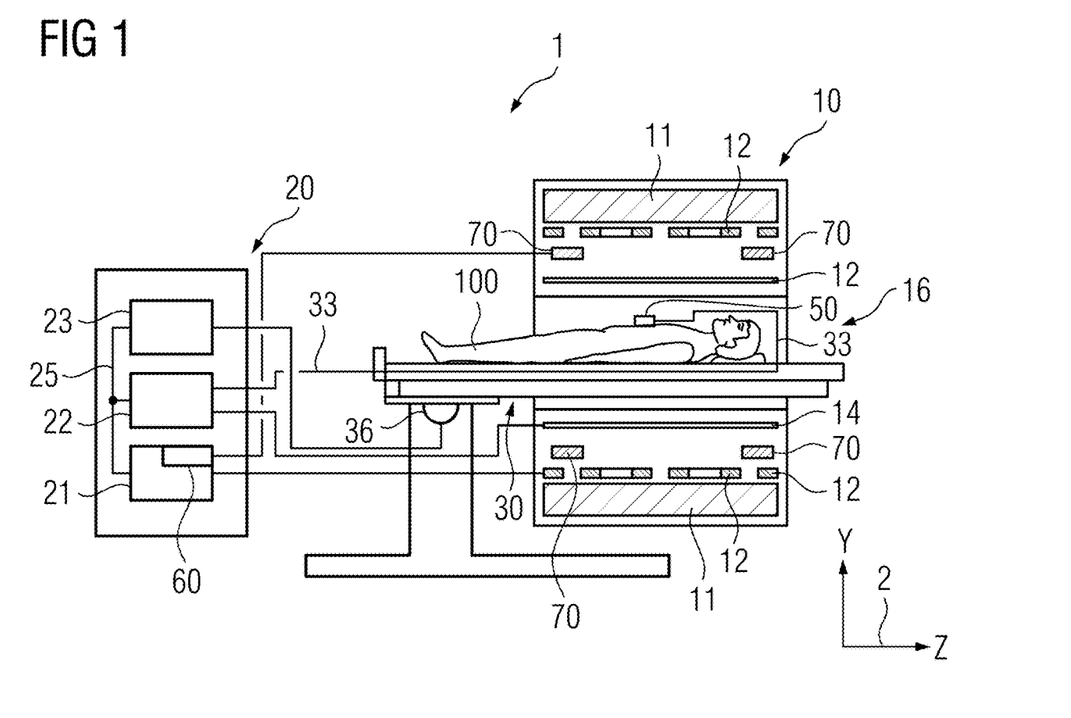
FIG. 1 depicts a schematic representation of an example of a magnetic resonance tomography system.

FIG. 1 depicts a schematic representation of an embodiment of a magnetic resonance tomography system 1.

The magnetic facility or unit 10 has a field magnet 11, which generates a static magnetic field B0 for the orientation of nuclear spins of samples or of the patient 100 in an acquisition area. The acquisition area is characterized by an extremely homogeneous static magnetic field B0, wherein the homogeneity relates, in particular, to the magnetic field strength or the value. The acquisition area is almost spherical and arranged in a patient tunnel 16, which extends in a longitudinal direction 2 through the magnetic unit 10. A patient couch 30 may be moved in the patient tunnel 16 by the positioning unit 36. Conventionally, the field magnet 11 is a superconducting magnet, which may provide magnetic fields with a magnetic flux density of up to 3 T, even above this in the newest devices. For low magnetic field strengths, permanent magnets, or electromagnets with normal conducting coils may also be used.

Furthermore, the magnetic unit 10 has gradient coils 12, which for spatial differentiation of the captured mapping regions in the examination volume, are configured to overlay the magnetic field B0 with temporally and spatially variable magnetic fields in three spatial directions. The gradient coils 12 are conventionally coils from normal conducting wires, which may generate mutually orthogonal fields in the examination volume.

The magnetic unit 10 also has a body coil 14, which is configured to emit a high frequency signal fed via a signal line into the examination volume and to receive resonance signals emitted by the patient 100 and pass them via a signal line.

A control unit 20 supplies the magnetic unit 10 with the different signals for the gradient coils 12 and the body coil 14 and evaluates the received signals.

The control unit 20 thus has a gradient controller 21, which is configured to supply the gradient coils 12 via supply lines with variable currents, which provide the desired gradient fields in the examination volume in a time-coordinated manner.

Furthermore, the control unit 20 has a radio frequency unit 22, which is configured to generate a radio frequency pulse with a specified course over time, amplitude, and spectral power distribution for the excitation of a magnetic resonance of the nuclear spins in the patient 100. Pulse powers in the region of kilowatts may be achieved in this case. The excitation pulses may be emitted via the body coil 14 or also via a local transmit antenna into the patient 100.

A controller 23 communicates via a signal bus 25 with the gradient controller 21 and the radio frequency unit 22.

Arranged on the patient 100 is a local coil 50, which is connected by a connection line 33 to the radio frequency unit 22 and its receiver.

FIG. 1 also discloses the magnetic controller 60 for the change in the homogeneous magnetic field B0 as part of the gradient controller 21 but may also be designed completely separately therefrom. Two modulation coils 70 are supplied by the magnetic controller 60 and are arranged in the manner of a Helmholtz coil pair axially around the z-axis through the center of the patient tunnel 16. If both modulation coils 70 are actuated by the magnetic controller 70 with a current in the same flux direction in respect of the winding or direction of rotation around the z-axis, they generate a homogeneous magnetic field in the acquisition area or at least part of it, which is to be captured in a measurement, and will also be referred to as a measuring volume below. The generated homogeneous magnetic field of the modulation coils 70 is overlaid on the magnetic field of the superconducting field magnet 11 and together therewith generates a variable homogeneous B0 field.

Basically, within the framework of the disclosure, it is also conceivable to use the gradient coils 12 in pairs, in other words, the opposing Gx-coil pair, Gy-coil pair, or Gz-coil pair for a homogeneous change in the magnetic field strength of the homogeneous magnetic field B0. For this, the gradient controller 21, as the magnetic controller 60, has to be fitted with independent drivers for both magnetic coils of a pair, however, in order to generate a direct current component in the same direction in both coils of the pair. In other words, if the current through the coils is regarded as a vector, wherein, with the same current direction, the coils of a pair generate magnetic fields with opposing direction in a measuring volume, the coils of a pair, when used as a gradient coil, are wired such that the current through the first coil flows precisely in the opposite direction to the current direction of the second coil of the pair. In the case of an addition of the currents with signs, when used as gradient coils the two then have an opposing sign and are cancelled out, so the generated magnetic fields are likewise cancelled correspondingly in the plane of symmetry between the coils of the pair. When used herein, by contrast, the magnetic fields of the two coils add up to an amount different from zero, and this constantly changes precisely the magnetic field strength of the homogeneous magnetic field over the measuring volume or the entire acquisition area. This may be achieved by separate power stages for generation of the currents for each individual coil of a pair, with the magnetic controller 60 being configured to feed both of them with a direct current component in the same direction for generating the homogeneous magnetic field.

Depending on sequence, the gradient fields are temporarily overlaid, as is also conventional in the prior art for the different sequences.

The homogeneous portion of the magnetic field B0 is changed by the magnetic controller 60 with the modulation coils 70 in synchronization with the sequence via the controller 23 between excitation of the nuclear spins and reception by the changed homogeneous magnetic field, however, so excitation and reception takes place at different frequencies due to the shift in the Larmor frequency with the magnetic field B0.

In an embodiment of the disclosure, the excitation of the nuclear spins takes place with a magnetic field B0, which results in a Larmor frequency, which lies in an ISM band. The definition of these bands may be found in the introduction to the description. Higher electromagnetic emissions into the environment are permissible in these ISM bands, so the limit values may also be adhered to, optionally also with the aid of active interference suppression by way of destructive interference, without cost-intensive shielding rooms.

Reception, by contrast, is shifted due to a change in the homogeneous magnetic field B0 and shift associated therewith in the Larmor frequency into a frequency range outside of the ISM band. Owing to the lower permissible emission values in this band, the interference level due to other sources is also lower and reception of the weak MR signal may take place, optionally also again with the aid of active interference suppression and other interference suppression measures, also without shielding rooms, with a sufficient signal-to-noise ratio for imaging. The magnetic controller has to be capable of switching or controlling the magnetic field generated by the modulation coils 70 sufficiently quickly between the two values.

In another embodiment, the homogeneous magnetic field is not changed constantly in magnetic field strength over the reception period on reception of the magnetic resonance signals but varied over time. This may take place, for example, if the magnetic controller 60 actuates the modulation coils 70 as a code with an alternating current that varies over time. In the simplest case, this may be a sinusoidal signal. The modulation frequency is comparable to or shorter than the reciprocal value of the duration of the continuous reception of the magnetic resonance signal or a read train. Conversely, the modulation frequency is fundamentally lower, for example by more than a factor of 10, 100, 1,000, or 100,000 than the Larmor frequency, so, in collaboration with the amplitude, frequency spreading takes place due to the magnetic field change and change in the Larmor frequency associated therewith, which is smaller than a reception bandwidth of a receiver for the magnetic resonance signals and greater than the bandwidth of a disrupter. For example, the frequency spreading achieved may be greater than 100 Hz, 1 kHz, 10 kHz, or 100 kHz and lower than 1 MHz, 5 MHz, or 10 MHz.

Instead of the sinusoidal signal, any other signal that varies over time and has an appropriate frequency range may be used by the magnetic controller 60 for modulation of the current. For example, codes such as pseudo-random sequences, which are identified by autocorrelation and also demodulated again are also advantageous. The code used may not have any frequency components at the Larmor frequency or signal frequencies derived therefrom in the receive path.

Advantageously, frequency spreading means that a narrowband interference signal may be filtered out by an, for example, adaptive filter (e.g., notch filter) and only a small spectral portion of the spread magnetic resonance signal is lost.

A receiver of the radio frequency unit 22 demodulates the spread magnetic resonance signal after filtering as a function of the code used for spreading by way of complementary decoding in a decoding apparatus. With a sinusoidal current as the code, this corresponds, for example, to a demodulation of a frequency-modulated signal. With more complex code, decoding takes place correspondingly by way of the receiver as a function of the code, for example, in the case of pseudo-random sequences by autocorrelation. The original magnetic resonance signal may thus be restored and an image reconstruction may then take place by way of the controller 23, via the determined values in the k-space in order to display an image on an output unit.

It is also conceivable, however, that, depending on the code used, decoding is a direct part of generation of the points in the k-space and these are generated directly as a function of the code directly from the received, frequency-spread magnetic resonance signal.

It is also possible to combine both embodiments in order to minimize interference. For this, the magnetic controller 60, in addition to a constant direct current component, feeds a current that varies over time with a code for frequency spreading into the modulation coils 70. Advantageously, the shift takes place in less disrupted frequency ranges as a result and at the same time narrowband disrupters may be filtered out.

FIG. 2 illustrates once again the components of the magnetic resonance tomography system directly involved in the disclosure. Identical reference numerals designate identical objects.

Figure 2:
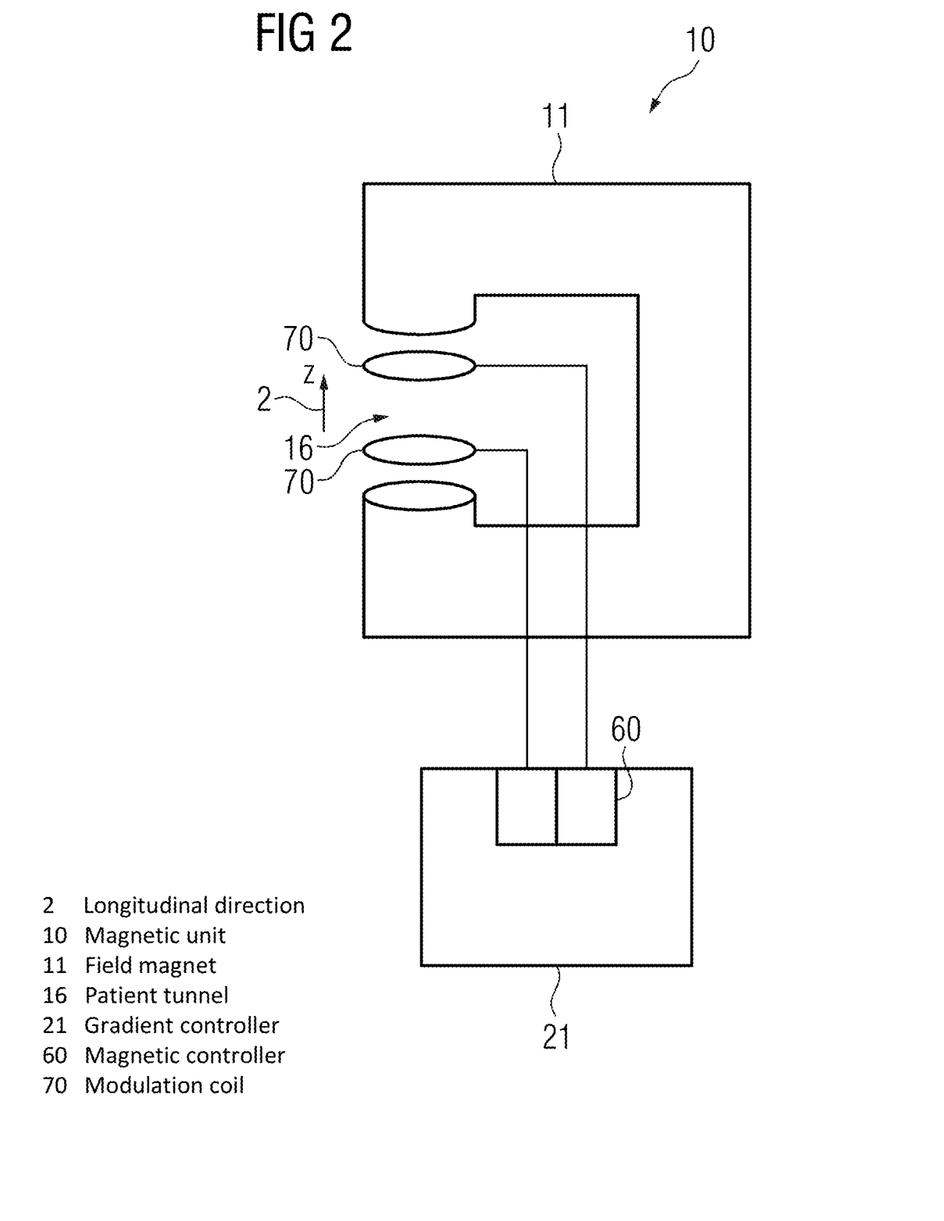
FIG. 2 depicts a schematic representation of an exemplary embodiment of specific components.

A permanent magnet is indicated here as an example of different field magnets 11. In this exemplary embodiment, the modulation coils 70 are simultaneously also used as gradient coils for the z-direction 2 in that the magnetic controller 60 is configured with two power stages for independent actuation of the individual coils of the pair. Thus, in addition to the gradient current flowing in the two coils, which has the same value but reverse sign, a current that is the same in both coils may also be overlaid for a homogeneous magnetic field shift or also applied separately over time.

Owing to the different requirements on the frequency response, in particular, in the case of frequency spreading, the accuracy, and the homogeneity, the above-described separate modulation coils 70 may also be advantageous, however.

Figure 3:
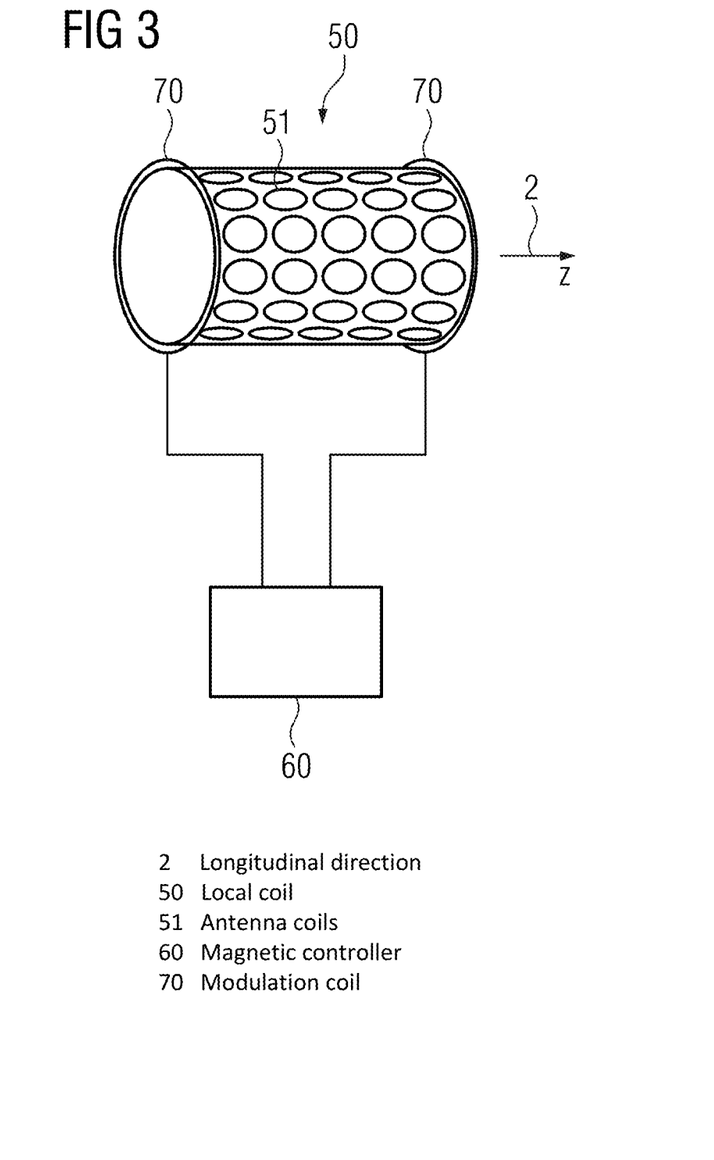
FIG. 3 depicts a schematic representation of an exemplary embodiment of specific components.

FIG. 3 illustrates an embodiment in which the modulation coils 70 do not cause a homogeneous B0 field change in the entire acquisition area, but in a local coil only in a limited examination region. By way of example, FIG. 3 depicts a knee coil as the local coil 50 in which the knee is surrounded on the outer circumference by antenna coils 51 for reception of the magnetic resonance signal. The two modulation coils 70 are arranged at the two openings of the knee coil in the manner of a Helmholtz pair, and as described, are supplied by the magnetic controller 60 with a current for the frequency shift and/or modulation. When used for imaging in the magnetic resonance tomography system, the z-axis of the knee coil is oriented substantially parallel with the z-axis of the B0 field of the field magnet 11.

The principle of the knee coil in FIG. 3 may also be applied to other local coils, such as spine coils or head coils. An arrangement of a circular modulation coil perpendicular to the z-direction is not possible in this case, so the B0 field may also be homogeneously changed in a limited measuring volume by a pair of opposing butterfly or saddle coils oriented parallel to the z-direction.

Figure 4:
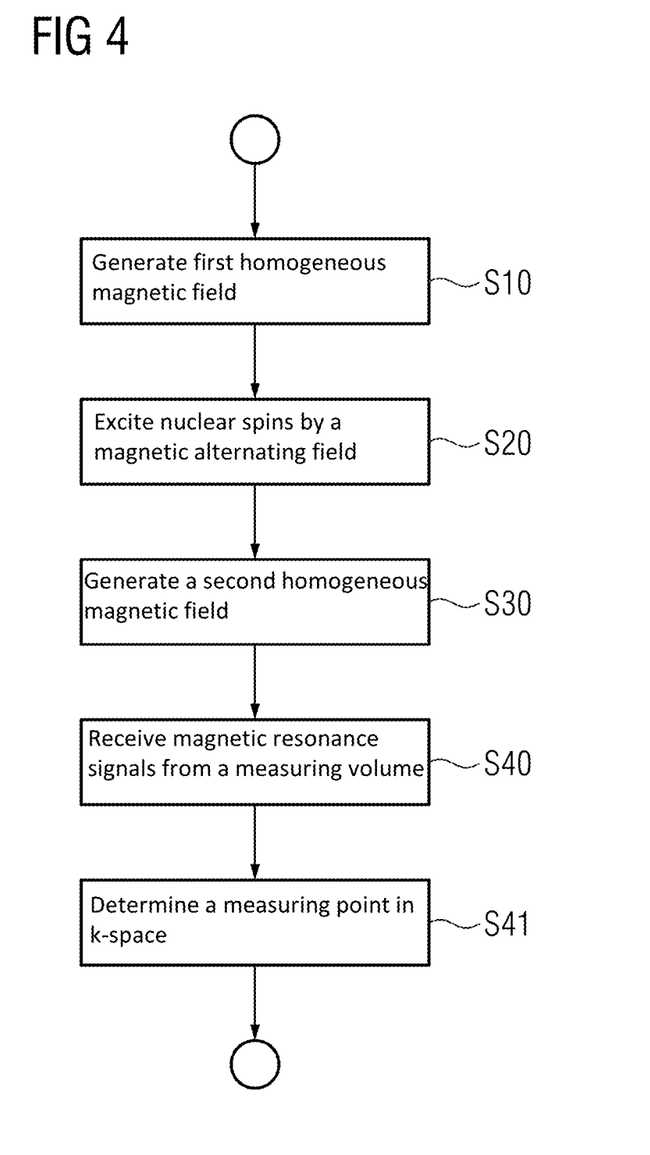
FIG. 4 depicts a schematic flowchart of an exemplary method.

FIG. 4 depicts a schematic flowchart of one possible embodiment of the method.

In act S10, the magnetic unit 10 generates a first homogeneous magnetic field with a predetermined magnetic field strength B01 in a measuring volume. The magnetic field may be generated by overlaying a static field of a field magnet 11, (e.g., a superconducting magnet or a permanent magnet), and a homogeneous magnetic field that is variable over time. The magnetic field, which is variable over time and homogeneous in the measuring volume, may be generated by the described modulation coils 70 or corresponding gradient coils 12 if they are supplied with the appropriate current by the magnetic controller, which generates a parallel magnetic field in the two coils. This is in contrast to use as gradient coils 12 in which a magnetic field gradient is to be generated precisely by opposing magnetic fields, or shim coils, which are to compensate field inhomogeneities of the field magnet 11 by way of a separate inhomogeneous field.

The homogeneous B0 field may be overlaid by a field gradient of the gradient coils 12 as a function of the sequence still. From the point of view of the sequence, the B0 field generated by field magnet 11 and modulation coils 70 is equivalent to a correspondingly strong magnetic field of a field magnet 11.

In act S20, the nuclear spins to be captured are excited in the measuring volume by the magnetic alternating field B1 by way of a transmitter of the radio frequency unit 22 in conjunction with an antenna, (e.g., a body coil 14 or a local coil 50), in the first homogeneous magnetic field B01. The type of excitation pulse is predetermined by the sequences of the magnetic resonance tomography system used.

In act S30, with the magnetic unit 10 the magnetic controller generates, as already described in relation to act S10, a second homogeneous magnetic field with a second magnetic field strength B02 in the measuring volume. The magnetic field strength B01 differs from the magnetic field strength B02. It is also conceivable, in particular, that in one of the two acts S10 or S30, the homogeneous magnetic field B0 is generated solely by the field magnet 11, without by way of an actuation by the magnetic controller 60. The different magnetic field strength B01 in S10 and B02 in S30 is then provided by the actuation in the other act, respectively.

In act S40, with a magnetic field strength B02, the magnetic resonance signal of the excited nuclear spins is received by the receiver of the magnetic resonance tomography system 1.

In an embodiment of the method, during the act S20 of exciting, the first homogeneous magnetic field has a magnetic field strength B01 in which a Larmor frequency of the nuclear spins to be examined lies in an ISM band. Further, the second homogeneous magnetic field, during the act S40 of receiving, has a magnetic field strength in which a Larmor frequency of the nuclear spins to be examined lies outside of the ISM band. In other words, an excitation of the nuclear spins takes place with an excitation pulse whose frequency lies in an ISM band, while the receiving of the nuclear spins takes place in a magnetic field with the magnetic field strength B02 in which the Larmor frequency lies outside of the ISM band. On excitation, electromagnetic emissions are thus subject to less strict rules, while on receiving, the magnetic resonance signals lie in a less disrupted frequency range and the signal-to-noise ratio is improved.

In one conceivable embodiment of the method, the second homogeneous magnetic field has a magnetic field strength variable over time and modulated with a code during the act S40 of receiving. In other words, the magnetic field strength assumes not just a second predetermined value B02 that is different from B01 during receiving, but beyond the period of receiving also a third different value or many different values. The magnetic field strength of the magnetic field which is homogeneous in the measuring volume varies over time and at least one real subset of the period may also temporarily assume the value B01. Owing to the magnetic field strength which varies over time during reception, the magnetic resonance signal is frequency modulated and spread in the frequency range. It is thus also conceivable, by way of a current from the magnetic controller 60 modulated with a code, to perform a modulation of the magnetic resonance signal with a code through the modulation coil 70.

In act S41 of this embodiment of the method, the magnetic resonance tomography system determines by a decoding apparatus a measuring point in the k-space from the received frequency-spread magnetic resonance signal as a function of the code. With a simple code, such as a sine curve of the current, it is conceivable, firstly by demodulation in the decoding apparatus, to reconstruct the unspread magnetic resonance signal and to then determine the k-space points with the known means. With more complex code, it is also conceivable, however, by way of changed image reconstruction methods, to determine the k-space points, and, from these, image points, directly without the intermediate act of reconstructing the original magnetic resonance signal.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

Although the disclosure has been illustrated and described in detail with reference to the exemplary embodiments, it is not limited by the disclosed examples and a person skilled in the art may derive other variations herefrom without departing from the scope of the disclosure.

The invention claimed is:

1. A magnetic resonance tomography system comprising:
    a magnetic unit; and
    a magnetic controller,
    wherein the magnetic unit is configured, by the magnetic controller, to change a homogeneous magnetic field B0 with a magnetic field strength,
    wherein the magnetic field strength, as controlled by the magnetic resonance tomography system, is configured to vary between a first predetermined value of the magnetic field strength on exciting nuclear spins and a second predetermined value of the magnetic field strength on receiving magnetic resonance signals, in a measuring volume in a short predetermined time.

2. The magnetic resonance tomography system of claim 1, wherein a Larmor frequency of a nucleus to be examined lies in an Industrial, Scientific, Medical (ISM) band in a case of the first predetermined value of the magnetic field strength and lies outside of the ISM band in a case of the second predetermined value of the magnetic field strength.

3. The magnetic resonance tomography system of claim 2, further comprising:
    a sensor configured to receive an interference signal; and
    an active interference suppression for reducing an interference signal component in a received magnetic resonance signal as a function of the received interference signal.

4. The magnetic resonance tomography system of claim 3, wherein the magnetic unit further comprises: a superconducting field magnet for generating a static magnetic field component; and a resistive coil winding for generating a dynamic magnetic field component for modulation of the magnetic field strength.

5. The magnetic resonance tomography system of claim 4, wherein the magnetic controller is configured to modulate the homogeneous magnetic field B0 in the magnetic field strength with a code in order to spread the received magnetic resonance signal in a frequency domain.

6. The magnetic resonance tomography system of claim 5, further comprising:
    a receiver having a decoding apparatus, wherein the decoding apparatus is configured to determine, from a spread magnetic resonance signal frequency, spreading caused by the modulation of the homogeneous magnetic field B0 with code measuring points in k-space as a function of the code.

7. The magnetic resonance tomography system of claim 2, wherein the magnetic unit further comprises: a superconducting field magnet for generating a static magnetic field component; and a resistive coil winding for generating a dynamic magnetic field component for modulation of the magnetic field strength.

8. The magnetic resonance tomography system of claim 2, wherein the magnetic controller is configured to modulate the homogeneous magnetic field B0 in the magnetic field strength with a code in order to spread a magnetic resonance signal in a frequency domain.

9. The magnetic resonance tomography system of claim 8, further comprising:
a receiver having a decoding apparatus, wherein the decoding apparatus is configured to determine, from a spread magnetic resonance signal frequency, spreading caused by the modulation of the homogeneous magnetic field B0 with code measuring points in k-space as a function of the code.

10. The magnetic resonance tomography system of claim 1, further comprising:
a sensor configured to receive an interference signal; and
an active interference suppression for reducing an interference signal component in a received magnetic resonance signal as a function of the received interference signal.

11. The magnetic resonance tomography system of claim 1, wherein the magnetic unit further comprises: a superconducting field magnet for generating a static magnetic field component; and a resistive coil winding for generating a dynamic magnetic field component for modulation of the magnetic field strength.

12. The magnetic resonance tomography system of claim 1, wherein the magnetic controller is configured to modulate the homogeneous magnetic field B0 in the magnetic field strength with a code in order to spread a magnetic resonance signal in a frequency domain.

13. The magnetic resonance tomography system of claim 12, further comprising:
a receiver having a decoding apparatus, wherein the decoding apparatus is configured to determine, from a spread magnetic resonance signal frequency, spreading caused by the modulation of the homogeneous magnetic field B0 with code measuring points in k-space as a function of the code.

14. A method for operation of a magnetic resonance tomography system, the method comprising:
generating, by a magnetic unit of the magnetic resonance tomography system, a first homogeneous magnetic field B0 with a first predetermined magnetic field strength in a measuring volume;
exciting, by a transmitter and transmit antenna of the magnetic resonance tomography system in the first homogeneous magnetic field, nuclear spins by a magnetic alternating field B1;

generating, by the magnetic unit, a second homogeneous magnetic field with a predetermined magnetic field strength in the measuring volume by way of the magnetic unit; and
receiving, by a receiver and receive antenna of the magnetic resonance tomography system, magnetic resonance signals from the measuring volume,
wherein the first homogeneous magnetic field and the second homogeneous magnetic field differ in magnetic field strength.

15. The method of claim 14, wherein, during the exciting of the nuclear spins, the first homogeneous magnetic field has a magnetic field strength at which a Larmor frequency of the nuclear spins to be examined lies in an Industrial, Scientific, Medical (ISM) band, and
wherein, during the receiving of the magnetic resonance signals, the second homogeneous magnetic field has a magnetic field strength at which a Larmor frequency of the nuclear spins to be examined lies outside the ISM band.

16. The method of claim 14, wherein the second homogeneous magnetic field has a magnetic field strength which varies over time and is modulated with a code during the receiving.

17. The method of claim 16, wherein the magnetic resonance tomography system has a decoding apparatus, and
wherein the method further comprises determining the decoding apparatus from a spread magnetic resonance signal frequency spreading caused by the modulation of the first homogeneous magnetic field B0 with the code measuring points in a k-space as a function of the code.

18. A non-transitory computer program product configured to be loaded directly into a processor of a programmable controller, wherein the computer program product, when executed by the controller, is configured to cause a magnetic resonance tomography system to:
generate, by a magnetic unit of the magnetic resonance tomography system, a first homogeneous magnetic field B0 with a first predetermined magnetic field strength in a measuring volume;
excite, by a transmitter and transmit antenna of the magnetic resonance tomography system, nuclear spins by a magnetic alternating field B1 by way of the transmitter in the first homogeneous magnetic field;
generate, by the magnetic unit, a second homogeneous magnetic field with a predetermined magnetic field strength in the measuring volume by way of the magnetic unit; and
receive, by a receiver and receive antenna of the magnetic resonance tomography system, magnetic resonance signals from a measuring volume,
wherein the first homogeneous magnetic field and the second homogeneous magnetic field differ in magnetic field strength.

* * * * *